(12) United States Patent
Wang et al.

(10) Patent No.: US 12,520,679 B2
(45) Date of Patent: Jan. 6, 2026

(54) DISPLAY SUBSTRATE AND MANUFACTURING METHOD THEREFOR, DISPLAY PANEL, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Yangpeng Wang, Beijing (CN); Baek Woon Lee, Beijing (CN); Baolei Huo, Beijing (CN); Tinglan Zhu, Beijing (CN); Yuanyuan Chai, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 719 days.

(21) Appl. No.: 17/792,255

(22) PCT Filed: Aug. 6, 2021

(86) PCT No.: PCT/CN2021/111321
§ 371 (c)(1),
(2) Date: Jul. 12, 2022

(87) PCT Pub. No.: WO2022/062726
PCT Pub. Date: Mar. 31, 2022

(65) Prior Publication Data
US 2023/0045264 A1   Feb. 9, 2023

(30) Foreign Application Priority Data

Sep. 28, 2020 (CN) .......................... 202011043924.1

(51) Int. Cl.
*H10K 59/131* (2023.01)
*H10D 86/40* (2025.01)
(Continued)

(52) U.S. Cl.
CPC ......... *H10K 59/131* (2023.02); *H10D 86/441* (2025.01); *H10D 86/60* (2025.01);
(Continued)

(58) Field of Classification Search
CPC .. H10K 59/131; H10K 59/60; H10K 59/1201; H10K 59/1213; H10K 59/122; H10K 59/65; H10K 71/00
See application file for complete search history.

(56) References Cited

U.S. PATENT DOCUMENTS

2020/0105843 A1   4/2020 Baek et al.
2020/0124932 A1*  4/2020 Yang ................ G02F 1/136286
(Continued)

FOREIGN PATENT DOCUMENTS

CN   110504289 A   11/2019
CN   110957344 A   4/2020
(Continued)

*Primary Examiner* — Jasmine J Clark
(74) *Attorney, Agent, or Firm* — IPro, PLLC

(57) ABSTRACT

The display substrate includes: a first electrode located in a first display region and a second electrode located in a second display region; a first light emitting layer located in the first display region and a second light emitting layer located in the second display region; and a third electrode located in the first display region and a fourth electrode located in the second display region. By optimizing patterned design of the third electrode, a first electrode wiring mode in the first display region is optimized, so that a display effect in the first display region is improved, glare interference is reduced, the transmittance of the first display region is optimized and improved, and a photographing effect of an under-screen camera configured in the first display region is ensured.

18 Claims, 10 Drawing Sheets

First display region I | Second display region II

(51) Int. Cl.
*H10D 86/60* (2025.01)
*H10K 59/12* (2023.01)
*H10K 59/121* (2023.01)
*H10K 59/122* (2023.01)

(52) U.S. Cl.
CPC ....... *H10K 59/1213* (2023.02); *H10K 59/122* (2023.02); *H10K 59/1201* (2023.02)

(56) References Cited

U.S. PATENT DOCUMENTS

| | | |
|---|---|---|
| 2020/0127220 A1 | 4/2020 | Kim et al. |
| 2020/0235187 A1 | 7/2020 | Bae et al. |
| 2021/0066409 A1 | 3/2021 | Fan |
| 2021/0143364 A1 | 5/2021 | Jin |

FOREIGN PATENT DOCUMENTS

| | | |
|---|---|---|
| CN | 111092102 A | 5/2020 |
| CN | 111463239 A | 7/2020 |
| CN | 111509136 A | 8/2020 |

\* cited by examiner

DISPLAY SUBSTRATE AND MANUFACTURING METHOD THEREFOR, DISPLAY PANEL, AND DISPLAY DEVICE

CROSS REFERENCES TO RELATED APPLICATION

The present application is a national phase entry under 35 U.S.C § 371 of International Application No. PCT/CN2021/111321, filed on Aug. 6, 2021, which claims the priority to Chinese Patent Application No. 202011043924.1, filed to the China National Intellectual Property Administration on Sep. 28, 2020 and entitled "Display substrate and manufacturing method therefor, display panel and display device", which is incorporated in its entirety herein by reference.

FIELD

The present disclosure relates to the field of display, and in particular to a display substrate and a manufacturing method therefor, a display panel and a display device.

BACKGROUND

The solution of "under-screen cameras" has emerged currently because of increasing demand of users for diversified use and design requirements for a high screen-to-body ratio of display devices. In the solution of "under-screen cameras", with imaging modules such as cameras embedded in display regions, sizes of border regions of the display devices are reduced, thus increasing the screen-to-body ratio. At present, in the solution of "under-screen cameras", a wiring mode of the display devices, set positions of pixel light emitting units, etc. have become the focus and difficulty of current research.

The above information disclosed in this part is only used for understanding of the background of the technical concept of the present disclosure, and therefore the information may contain information that does not constitute the prior art.

SUMMARY

A display substrate provided in embodiments of the present disclosure includes:
 a substrate;
 a first display region and a second display region, arranged on the substrate;
 a thin film transistor layer arranged on the substrate, and a planarization layer arranged at a side of the thin film transistor layer away from the substrate;
 a plurality of signal traveling lines, electrically connected to the thin film transistor layer in the first display region;
 a plurality of first electrodes arranged in the first display region and a plurality of second electrodes arranged in the second display region, where the plurality of first electrodes and the plurality of second electrodes are arranged at a side of the planarization layer away from the substrate;
 a pixel defining layer arranged at a sides of the plurality of first electrodes and the plurality of second electrodes away from the substrate, where the pixel defining layer include a plurality of first openings arranged in the first display region and a plurality of second openings arranged in the second display region, each of the plurality of first openings exposes at least part of one of the plurality of first electrodes, and each of the plurality of second openings exposes at least part of one of the plurality of second electrodes;
 a plurality of light emitting layers arranged on the plurality of first openings and the plurality of second openings; and
 a plurality of third electrodes and a plurality of fourth electrodes, arranged at a side of the plurality of light emitting layers away from the substrate, where the plurality of third electrodes are arranged in the first display region, and the plurality of fourth electrodes are arranged in the second display region; and
 an orthographic projection of each of the plurality of third electrodes on the substrate covers orthographic projections of M number of first openings on the substrate, and an orthographic projection of each of the plurality of fourth electrodes on the substrate covers orthographic projections of N number of second openings on the substrate, wherein M is less than N.

In some examples, M is equal to 1, N is greater than or equal to 2, and a quantity of the plurality of fourth electrode is 1.

In some examples, the display substrate further includes a plurality of first electrode wirings arranged in the first display region. The plurality of first electrode wirings is arranged at a side of the planarization layer away from the substrate.

In some examples, each of the plurality of third electrodes further includes a third electrode connection part corresponding to the each third electrode. The each third electrode is electrically connected to a corresponding first electrode wiring via the third electrode connection part. A quantity of third electrode connection parts is less than or equal to a quantity of the plurality of first openings.

In some examples, the plurality of signal traveling lines are arranged in the same layer as a source electrode and a drain electrode in the thin film transistor layer. Orthographic projections of the plurality of first electrode wirings on the substrate overlap orthographic projections of the plurality of signal traveling lines on the substrate, with an overlapping area not less than 90%.

In some examples, a transition region is further provided between the first display region and the second display region;
 the thin film transistor layer, in the transition region, is provided with a first pixel circuit structure for controlling and driving pixels in the first display region to emit light and a transition pixel circuit structure for controlling and driving pixels in the transition region to emit light.

In some examples, any one of the plurality of first electrodes is electrically connected to a first signal wire via a first electrode via hole;
 the first signal wire extends from the first display region to the transition region, and transmits circuit signal of the first pixel circuit structure arranged in the transition region to a corresponding first electrode arranged in the first display region.

In some examples, a periphery of the display substrate is further provided with a peripheral wiring region. Any one of the plurality of fourth electrodes is electrically connected to a second signal wire by lapping a second electrode wiring, so as to receive a second supply voltage signal.

In some examples, in the peripheral wiring region, a first electrode wiring directly laps the second signal wire, such that a corresponding third electrode receives a second supply voltage signal.

In some examples, the peripheral wiring region is provided with a first peripheral blocking dam and a second peripheral blocking dam. An orthographic projection of the first peripheral blocking dam on the substrate is located in an orthographic projection of the second electrode wiring on the substrate and an orthographic projection of the second signal wire on the substrate. An orthographic projection of the second peripheral blocking dam on the substrate partially overlaps with the orthographic projection of the second electrode wiring on the substrate and partially overlaps with the orthographic projection of the second signal wire on the substrate.

In some examples, an orthographic projection of the first electrode wiring on the substrate does not overlap with the orthographic projection of the first peripheral blocking dam on the substrate and does not overlap with the orthographic projection of the second peripheral blocking dam on the substrate.

In some examples, materials of the plurality of third electrodes, the plurality of fourth electrodes, the plurality of first electrode wirings and the plurality of signal traveling lines include at least one of indium tin oxide and indium zinc oxide; and the materials of the plurality of fourth electrodes further include at least one of magnesium and silver.

A method for manufacturing a display substrate provided in the embodiments of the present disclosure includes:
providing the substrate;
configuring the first display region and the second display region on the substrate;
sequentially forming the thin film transistor layer and the planarization layer on the substrate;
forming, by the thin film transistor layer, a first pixel circuit structure in the first display region on the substrate and a second pixel circuit structure in the second display region on the substrate;
forming a plurality of first electrodes arranged in the first display region and a plurality of second electrodes arranged in the second display region at a side of the planarization layer away from the substrate;
forming a first light emitting layer at a side of each of the plurality of first electrodes away from the substrate, and forming a second light emitting layer at a side of each of the plurality of second electrodes away from the substrate; and
forming a third electrode at a side of the first light emitting layer away from the substrate, and forming a fourth electrode at a side of the second light emitting layer away from the substrate.

In some examples, the forming the third electrode at the side of the first light emitting layer away from the substrate, and forming the fourth electrode at the side of the second light emitting layer away from the substrate include: forming a first cathode material layer at the side of the second light emitting layer away from the substrate in the second display region, where materials of the first cathode material layers include at least one of magnesium and silver;
forming a second cathode material layer at the sides of the first light emitting layer in the first display region away from the substrate and the side of the second light emitting layer in the second display region away from the substrate, where in the second display region, the second cathode material layers are arranged at a side of the first cathode material layer away from the substrate; and
forming a plurality of third electrodes and a plurality of first electrode wirings by conducting laser cutting on the second cathode material layer in the first display region.

In some examples, forming a transition region on the substrate. The transition region is arranged between the first display region and the second display region. The transition region is provided with the first pixel circuit structure and a transition pixel circuit structure;
forming a fifth electrode, a third light emitting layer and a sixth electrode sequentially at a side of the transition pixel circuit structure away from the substrate.

In some examples, forming the sixth electrode at the side of the transition pixel circuit structure away from the substrate includes: forming the second cathode material layer in the transition region and the first display region; and
forming the sixth electrode and the third electrode by conducting laser cutting on the second cathode material layer.

The embodiments of the present disclosure further provide a display panel, which includes the display substrate.

The embodiments of the present disclosure further provide a display device, which includes the display panel.

DETAILED DESCRIPTION OF THE EMBODIMENTS

Figure 1A:
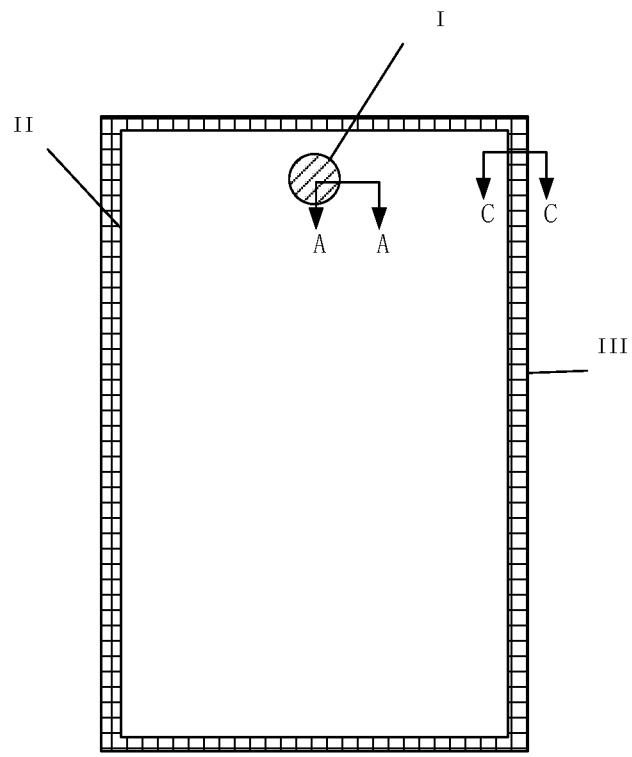
FIG. 1A is a first schematic diagram of a planar structure provided in an embodiment of the present disclosure.

For making the objectives, technical solutions and advantages of embodiments of the present disclosure more obvious, the technical solutions of the embodiments of the present disclosure will be clearly and completely described below in conjunction with the accompanying drawings. Apparently, the embodiments described are some rather than all of the embodiments of the present disclosure. Based on the embodiments of the present disclosure, all other embodiments acquired by those of ordinary skill in the art without making creative efforts fall within the scope of protection of the present disclosure.

It should be noted that in the drawings, for clarity and/or description, sizes and relative sizes of elements may be enlarged. Therefore, the size and relative size of each element are not necessarily limited to those shown in the drawings. In the description and drawings, the same or similar reference numerals denote the same or similar components.

When an element is described as being "on another element", "connected to another element", or "combined with another element", the element may be directly on another element, directly connected to another element, or directly combined with another element, or there may be an intermediate element. However, when an element is described as being "directly on another element", "directly connected to another element", or "directly combined with another element", there is no intermediate element. Other terms and/or expressions used to describe relations between elements should be interpreted in a similar way, such as "between" and "directly between", "adjacent" and "directly adjacent", or "on" and "directly on". In addition, the term "connection" may indicate physical connection, electrical connection, communication connection and/or fluid connection. As used herein, the term "and/or" includes any or all combinations of one or more in associated items that are listed.

It should be noted that although terms such as "first" and "second" may be used herein to describe various components, members, elements, regions, layers and/or parts, the components, members, elements, regions, layers and/or parts should not be limited by the terms. Further, the terms are used to distinguish one component, member, element, region, layer or part from another. Therefore, for example, a first component, a first member, a first element, a first region, a first layer and/or a first part discussed below may be referred to as a second component, a second member, a second element, a second region, a second layer and/or a second part without departing from the teaching of the present disclosure.

For convenience of description, spatial relation terms, such as "upper", "lower", "left" and "right" may be used herein to describe a relation between one element or feature and another element or feature as shown in the drawings. It should be understood that the spatial relation terms are intended to cover different orientations in use or operation in addition to the orientation of the device described in the drawings. For example, if the device in the drawings is upside down, the elements described as being "below" or "under" other elements or features will be oriented as "above" or "on" other elements or features.

The technical solution in the embodiments of the present disclosure is clearly and completely described below with reference to the accompanying drawings in the embodiments of the present disclosure. Apparently, the described embodiments are some rather than all of the embodiments of the present disclosure. Based on the embodiments of the present disclosure, all the other embodiments obtained by those of ordinary skill in the art without inventive effort are within the protection scope of the present disclosure.

The embodiments of the present disclosure provide a display substrate. The display substrate includes a first display region and a second display region that are formed on a substrate; a thin film transistor layer arranged on the substrate, and a planarization layer arranged at a side of the thin film transistor layer away from the substrate; a plurality of first electrodes arranged in the first display region and a plurality of second electrodes arranged in the second display region, where the first electrodes and the second electrodes are arranged at a side of the planarization layer away from the substrate; a pixel defining layer arranged at a side of the plurality of first electrodes and the plurality of second electrodes away from the substrate, where the pixel defining layer includes a plurality of first openings arranged in the first display region and a plurality of second openings arranged in the second display region, each of the plurality of first openings exposes at least part of one of the plurality of first electrodes, and each of the second openings exposes at least part of one of plurality of the second electrodes; a plurality of light emitting layers arranged on the plurality of first openings and the plurality of second openings; and a plurality of third electrodes and a plurality of fourth electrodes that are arranged at a side of the plurality of light emitting layers away from the substrate, where the plurality of third electrodes are arranged in the first display region, and the plurality of fourth electrodes are arranged in the second display region. An orthographic projection of each of the plurality of third electrodes on the substrate covers orthographic projections of M number of first openings on the substrate. An orthographic projection of each of the plurality of fourth electrodes on the substrate covers orthographic projections of N number of second openings on the substrate. M is less than N.

Figure 1B:
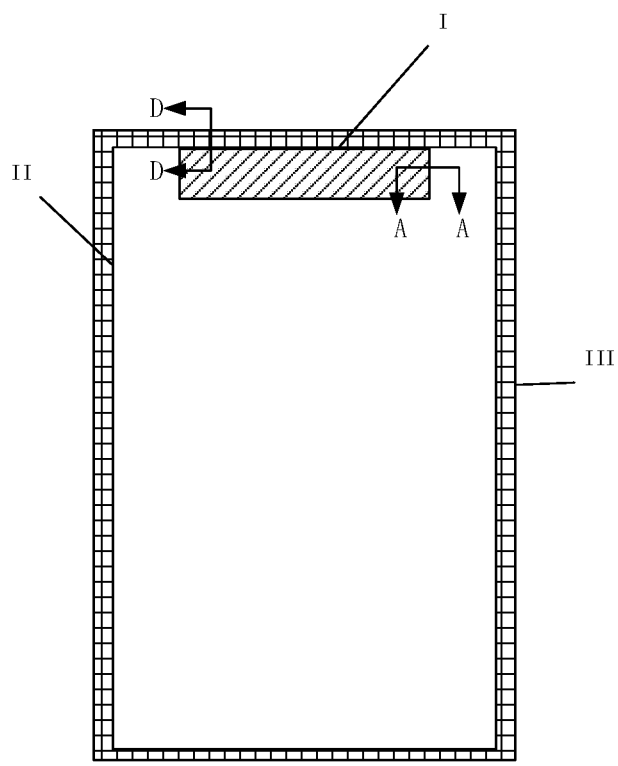
FIG. 1B is a second schematic diagram of a planar structure provided in an embodiment of the present disclosure.

FIGS. 1A and 1B are planar schematic diagrams of a display substrate according to some illustrative embodiments of the present disclosure. With reference to FIGS. 1A and 1B, the display substrate includes a first display region I and a second display region II that are formed on the substrate. The first display region I may be surrounded by the second display region II, or the second display region II may only surround part of a boundary of the first display region I. As shown in FIGS. 1A and 1B, the display substrate is further provided with a peripheral wiring region III arranged on the substrate, and the wiring region is configured to increase electrical signals for the first display region I or the second display region II, so as to ensure that the first display region I and the second display region II normally emit light.

Figure 2:
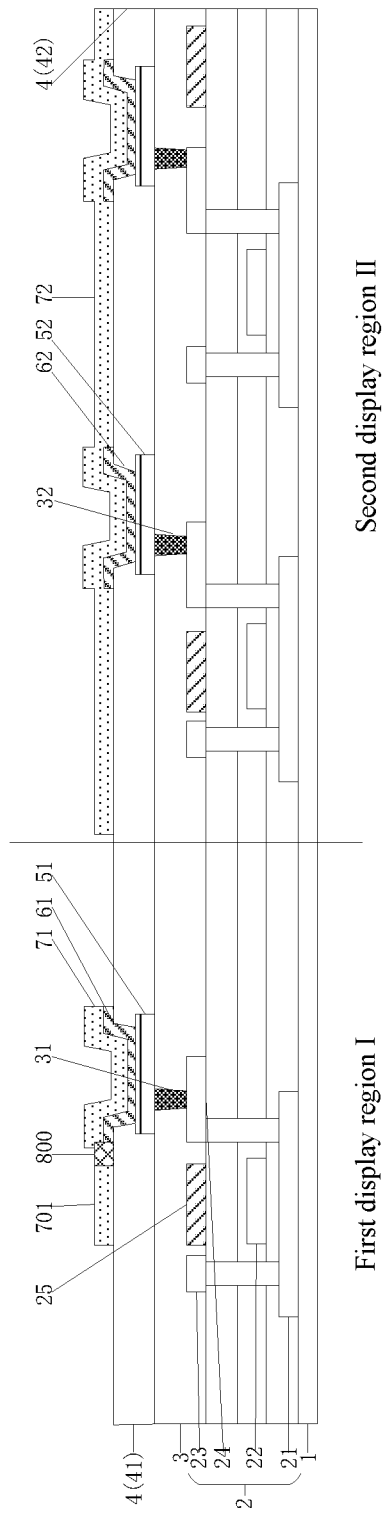
FIG. 2 is a sectional view of an A-A direction in FIG. 1A or 1B.
Figure 3A:
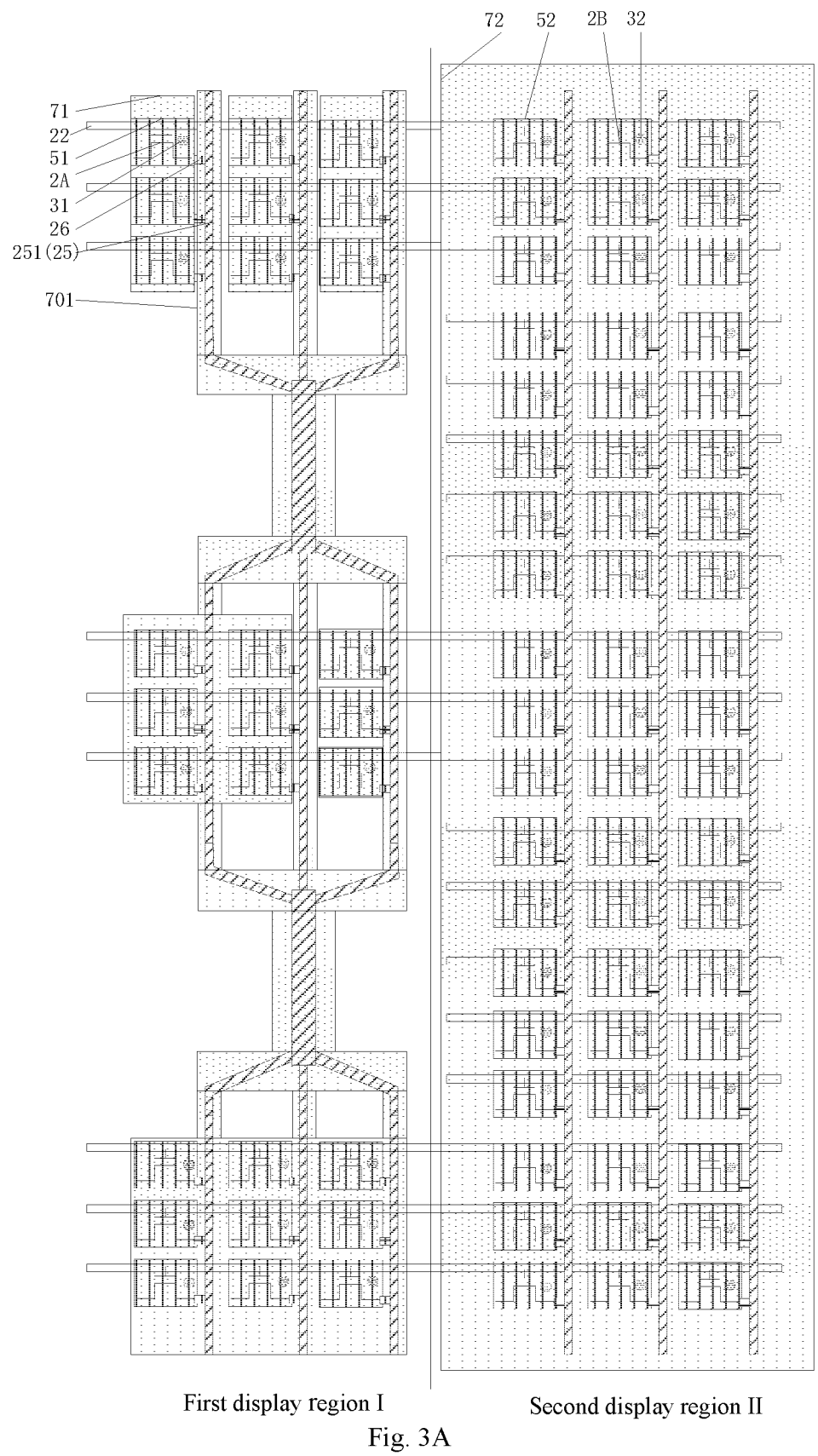
FIG. 3A is a first structural schematic diagram of a top view of a display substrate provided in an embodiment of the present disclosure.

FIG. 2 is a sectional view of an A-A direction of a joint of the first display region I and the second display region II in FIG. 1A or 1B. FIG. 3A is a top view of part of a joint of the first display region I and the second display region II. In some embodiments of the present disclosure, as shown in FIG. 2, the thin film transistor layer 2 is formed on the substrate 1, and the thin film transistor layer 2 includes an active layer 21, a gate layer 22, a source electrode 23 and a drain electrode 24. The thin film transistor layer 2 further includes a plurality of signal traveling lines 25 arranged in the same layer as the source electrode 23 and the drain electrode 24. As shown in FIG. 3A, the embodiments of the present application merely use a thin film transistor (TFT) structure to represent the thin film transistor layer 2 illustratively. A thin film transistor layer that actually drives each pixel to emit light includes, but is not limited to, nTmC (n and m are positive integers) pixel circuit structures such as 3T1C, 6T1C, 7T1C and 9T1C. In addition, the plurality of signal traveling lines 25 further include different signal wires for transmitting a first supply voltage signal (VDD) or a second supply voltage signal (VSS). For example, the plurality of signal traveling lines 25 include a plurality of first signal wires 251, and the plurality of first signal wires 251 each is electrically connected to the thin film transistor layer 2 through a via hole structure 26, so as to transmit power supply signals to different control transistors. FIG. 3A merely shows a via hole structure 26 illustratively. Positions and the number of via hole structures 26 are not limited during actual use. Besides, the thin film transistor layer 2 further includes other functional layers, such as a gate insulation layer, an interlayer dielectric layer, an inorganic passivation layer and other functional film layers that play an insulating role. In FIG. 3A, the thin film transistor layer 2 includes a first pixel circuit structure 2A arranged in the first display region I and a second pixel circuit structure 2B arranged in the second display region II. In the first display region I, the first pixel circuit structure 2A of each pixel is electrically connected to the first electrode 51 of a corresponding light emitting unit structure through a first electrode via hole 31, so as to drive the first display region I to achieve display. In the second display region II, the second pixel circuit structure 2B of each pixel is electrically connected to the second electrode 52 of a corresponding light emitting structure via a second electrode via hole 32, so as to drive the second display region II to achieve display.

In an illustrative embodiment of the present disclosure, the planarization layer 3 is further formed at a side of the thin film transistor layer 2 away from the substrate 1. The display substrate further includes the plurality of first electrodes 51 and the plurality of second electrodes 52 that are arranged at a side of the planarization layer 3 away from the substrate 1. FIG. 2 merely shows one first electrode 51 and two second electrodes 52 illustratively. The first plurality of electrodes 51 are arranged in the first display region I, and the plurality of second electrodes 52 are arranged in the second display region II. The number of the first electrodes 51 or the second electrodes 52 is multiple. A plurality of first pixel definition layers 41 arranged in the first display region I are formed at the side of the plurality of first electrodes 51 away from the substrate 1 and a plurality of second pixel definition layers 42 arranged in the second display region II are the side of the plurality of second electrodes 52 away from the substrate 1. The plurality of first pixel definition layers 41 define a plurality of first openings arranged in the first display region I, and the plurality of second pixel definition layers 42 define a plurality of second openings arranged in the second display region II. Each of the plurality of first openings exposes at least part of a first electrode 51 and each of the plurality of second openings exposes at least part of a second electrode 52. Further, a plurality of first light emitting layers 61 arranged in the first display region I are formed on the plurality of first openings in a one-to-one correspondence and a plurality of second light emitting layers 62 arranged in the second display region II are formed on the plurality of the second openings a one-to-one correspondence. The display substrate further includes the plurality of third electrodes 71 arranged in the first display region I and the plurality of fourth electrodes 72 arranged in the second display region II. The plurality of third electrodes 71 are arranged at a side of the plurality of first light emitting layers 61, and the plurality of fourth electrodes 72 are arranged at a side of the plurality of second light emitting layers 62 away from the substrate 1. A first electrode 51, a corresponding first light emitting layer 61 and a corresponding third electrode 71 jointly constitute a pixel light emitting unit structure in the first display region I. A second electrode 52, a corresponding second light emitting layers 62 and a corresponding fourth electrodes 72 jointly constitute a pixel light emitting unit structure in the second display region II. The number of the plurality of third electrodes 71 or the plurality of fourth electrodes 72 is multiple. An orthographic projection of each of the plurality of third electrodes 71 on the substrate 1 covers orthographic projections of M number of first openings on the substrate 1, and an orthographic projection of each of the plurality of fourth electrodes on the substrate covers orthographic projections of N number of second openings on the substrate 1. M is less than N.

In an illustrative embodiment of the present disclosure, as shown in FIG. 3A, in the first display region I, an orthographic projection of a third electrode 71 on the substrate 1 cover the orthographic projection of one first opening on the substrate 1, or the orthographic projections of 3 number of first openings on the substrate, or the orthographic projections 6 number of first openings on the substrate 1. In the second display region II, there is one fourth electrode 72, and an orthographic projection of the fourth electrode 72 on the substrate 1 covers orthographic projections of all the plurality of second openings on the substrate 1.

Figure 3B:
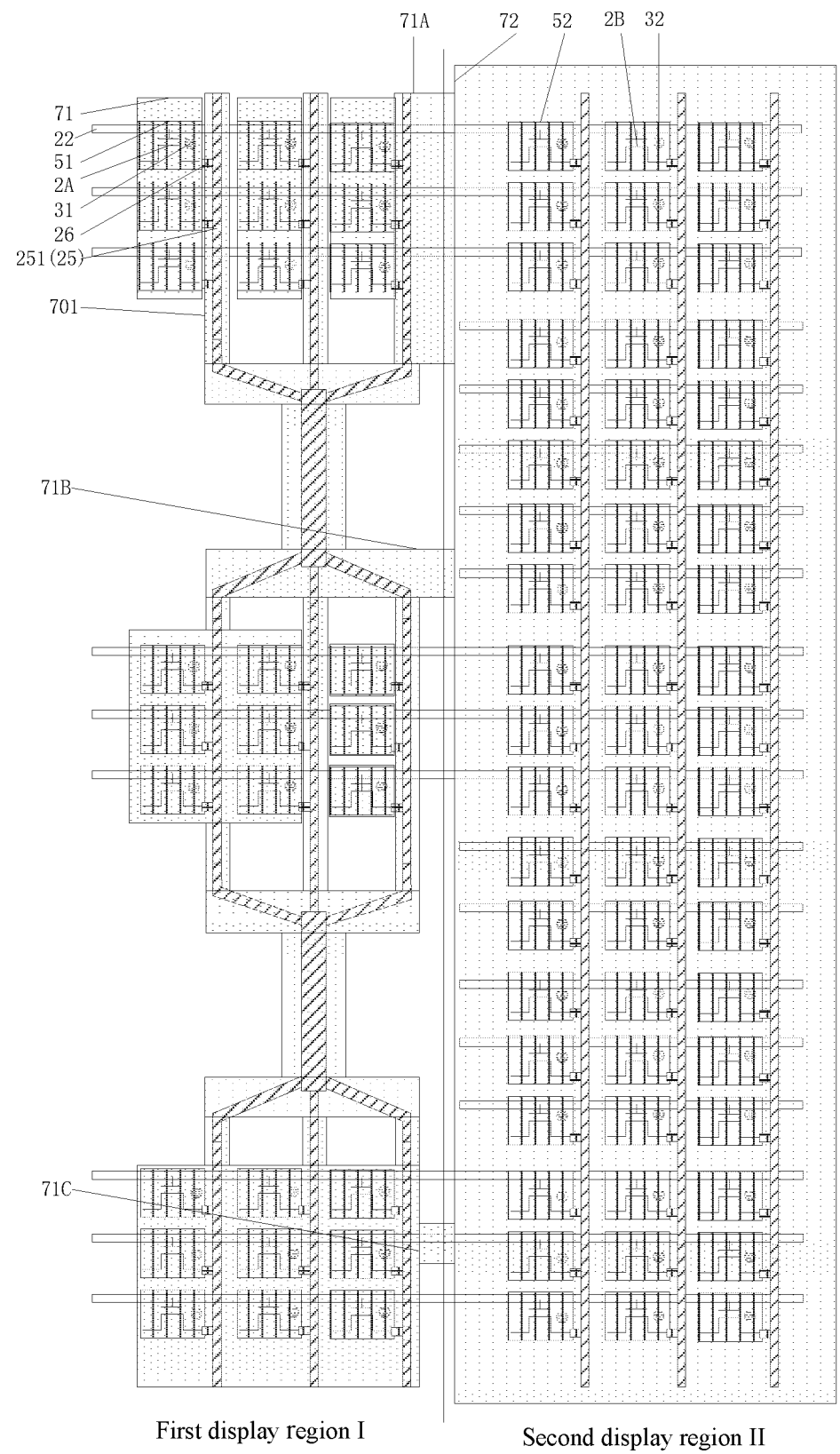
FIG. 3B is a second structural schematic diagram of a top view of a display substrate provided in an embodiment of the present disclosure.

In an illustrative embodiment of the present disclosure, as shown in FIG. 2, the first display region I is further provided with a first electrode wiring 701. It should be noted that in the embodiments, the number of first electrode wiring 701 is not limited. FIG. 2 is only an illustrative sectional view of the first display region I and only shows a partial sectional view of one piece of first electrode wiring 701, which does not represent an actual length of the first electrode wiring 701. Due to a high transmittance requirement in the first display region I, lower signal traveling line 25 is prone to glare at a light emitting side. Therefore, as shown in FIG. 3A, in the first display region I, an orthographic projection of the first electrode wiring 701 on the substrate 1 covers an orthographic projection of the signal traveling line 25 in the thin film transistor layer 2 on the substrate 1. In this way, a glare problem caused by patterning of the third electrodes 71 in the first display region I may be solved as much as possible. It should be noted that FIG. 3A merely shows a size and projection covering relation of the plurality of third electrodes 71 and a size and projection covering relation of the fourth electrode 72 illustratively. Signals connected with the plurality of third electrodes 71 will be explained in other illustrative embodiments. In an illustrative embodiment of the present disclosure, as shown in FIG. 3B, the plurality of third electrodes 71 in the first display region I may be directly electrically connected to the fourth electrode 72 in the second display region II via protrusion 71A or 71C, so as to receive a same voltage signal. Certainly, the plurality of third electrodes 71 may be further electrically connected to the fourth electrode 72 via the protrusion 71B of the first electrode wiring 701. In the embodiments, the size and position of the protrusion are not limited, as long as all of the plurality of third electrodes 71 in the first display region I are electrically connected to the fourth electrode 72 in the second display region II.

Figure 4:
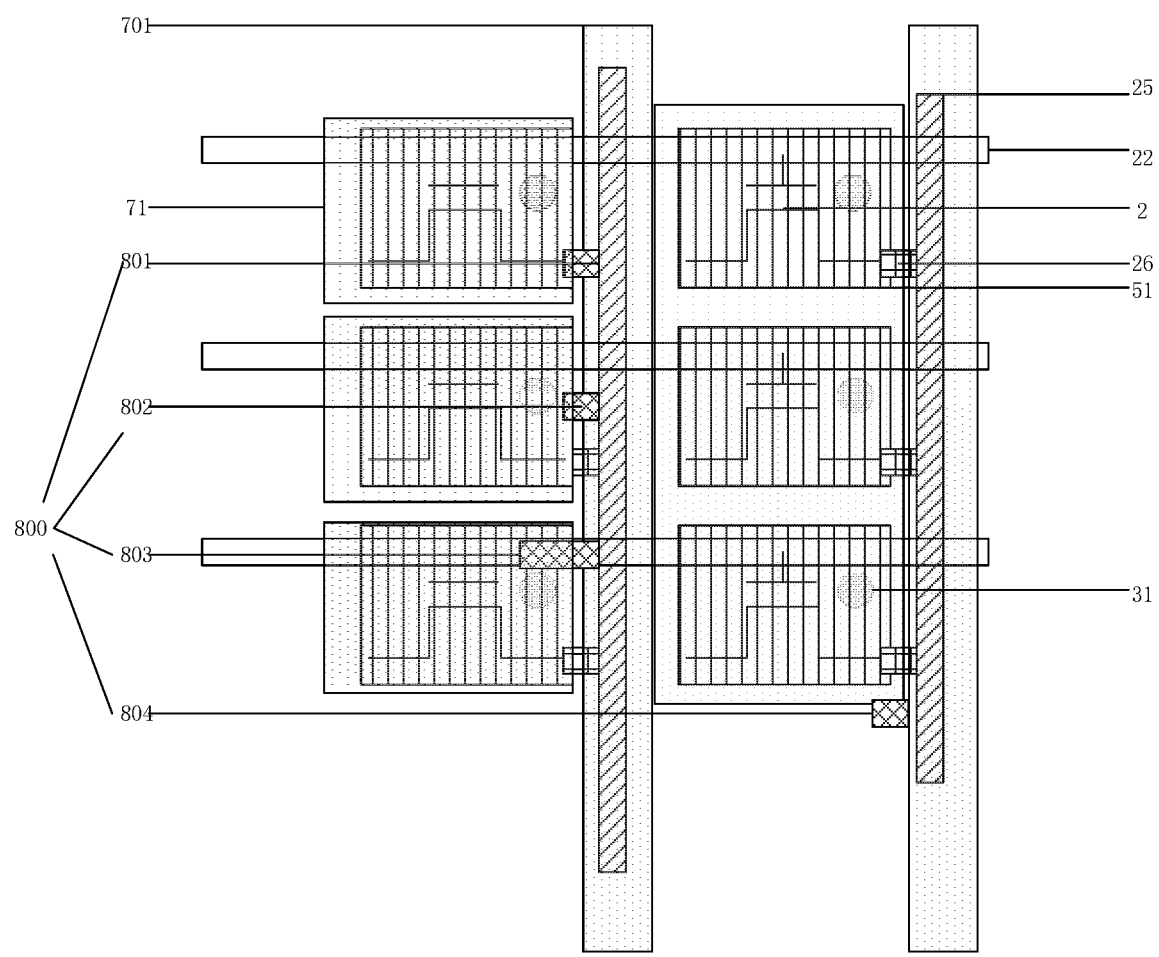
FIG. 4 is a structural schematic diagram of a top view of a part of a display substrate provided in an embodiment of the present disclosure.

In an illustrative embodiment of the present disclosure, as shown in FIG. 4, in the first display region I, the plurality of third electrodes 71 are electrically connected to a corresponding first electrode wiring 701 via a plurality of third electrode connection parts 800. In addition, FIG. 4 further shows connection modes of the plurality of third electrode connection parts 800 at different set positions. As shown in FIG. 4, an orthographic projection of a the third electrode connection part 801 (800) on the substrate 1 cover an orthographic projection of an via hole structure 26 on the substrate 1. In this way, a glare problem of the signal traveling line in the thin film transistor layer may be minimized. For example, in the embodiments, set positions of the plurality of third electrode connection parts may further be designed in other special modes according to requirements of actual display substrate wiring, pixel aperture ratios or light transmittance. As shown in FIG. 4, an orthographic projection of a third electrode connection part 802 (800) on the substrate 1 do not overlap the orthographic projection of the via hole structure 26 on the substrate 1. Alternatively, an orthographic projection of the third electrode connection part 803 (800) on the substrate 1 may be further located in an orthographic projection of a gate line of the gate layer 22 on the substrate. Alternatively, an orthographic projection of the third electrode connection part 804 (800) on the substrate 1 do not overlap the orthographic projections of the plurality of third electrodes 71 on the substrate 1. In this way, it may be ensured that light transmittance of pixel light emitting units corresponding to the third electrodes 71 electrically connected to the third electrode connection part is not influenced. In the embodiments, the number of third electrode connection parts is less than or equal to the number of the plurality of first openings. As shown in FIG. 4, the third electrode 71 corresponding to the third electrode connection part 804 cover 3 number of first openings, which corresponds to three pixel light emitting units. In this way, the number of the third electrode connection part 804 may be reduced, and a light transmittance requirement of the first display region I may be further ensured. Certainly, in the embodiments, the number of openings covered by the third electrodes 71 corresponding to the third electrode connection parts 804 may be 1, 3, 6, etc. Similarly, FIG. 4 merely shows a relation between the third electrodes 71 in the first display region I and the first electrode wiring 701 as well as the third electrode connection parts 800 illustratively. Voltage signals transmitted from the plurality of third electrodes 71 and access positions will be described in other embodiments.

In an illustrative embodiment of the present disclosure, as shown in FIG. 2, the first signal wire 251 is arranged at a side of the first electrode wiring 701 close to the substrate 1, and the first electrode via holes 31 arranged in the first display region I and the second electrode via holes 32 arranged in the second display region II are provided in the same layer as the first signal wire 251. The first electrode 51 in a light emitting unit structure of each pixel in the first display region I is electrically connected to a corresponding first pixel circuit structure 2A via a corresponding first electrode via hole 31. The second electrode 52 in a light emitting unit structure of each pixel in the second display region II is electrically connected to a corresponding second pixel circuit structure 2B via a corresponding second electrode via holes 32.

Figure 1C:
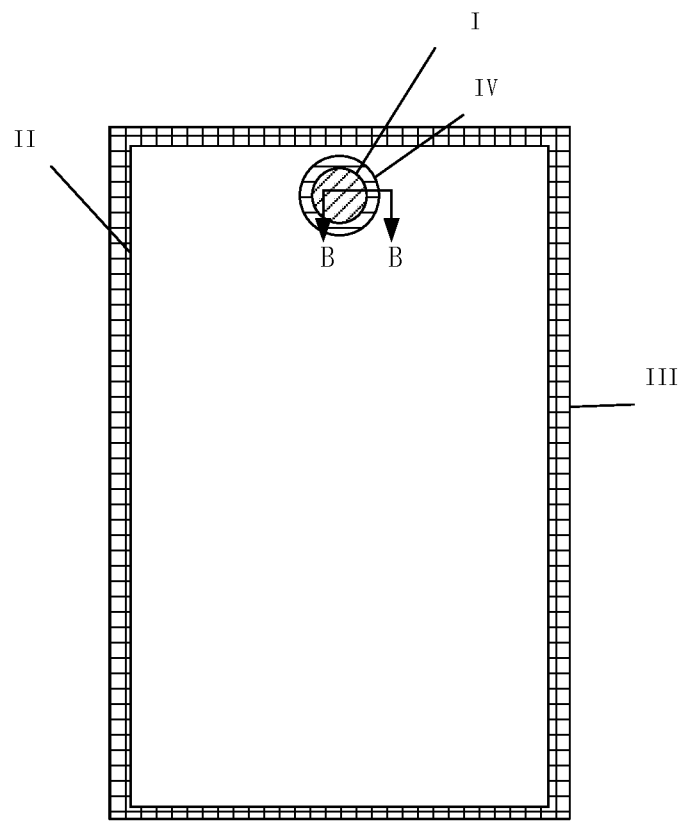
FIG. 1C is a third schematic diagram of a planar structure provided in an embodiment of the present disclosure.
Figure 1D:
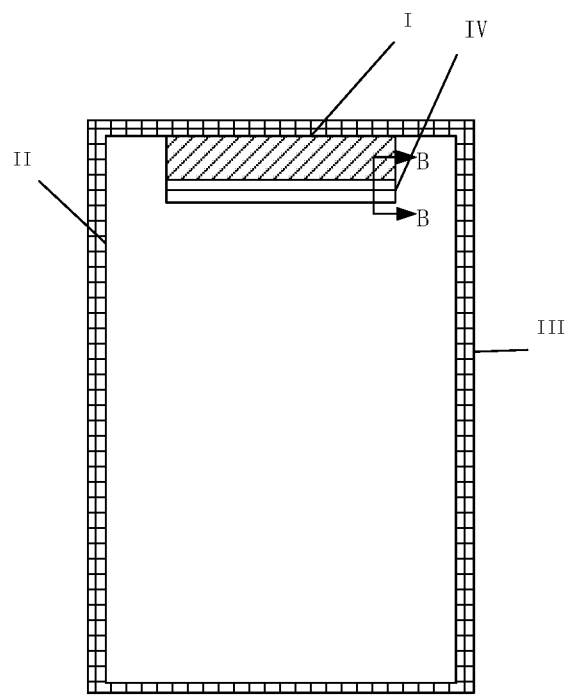
FIG. 1D is a fourth schematic diagram of a planar structure provided in an embodiment of the present disclosure.
Figure 5A:
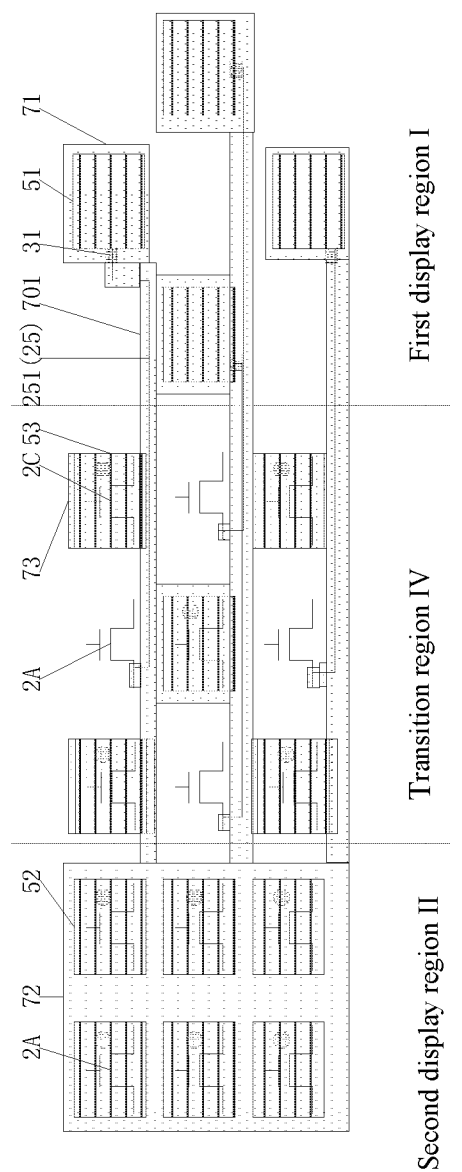
FIG. 5A is a first structural schematic diagram of a top view of a part of a junction of a first display region, a transition region and a second display region of a display substrate provided in an embodiment of the present disclosure.
Figure 6A:
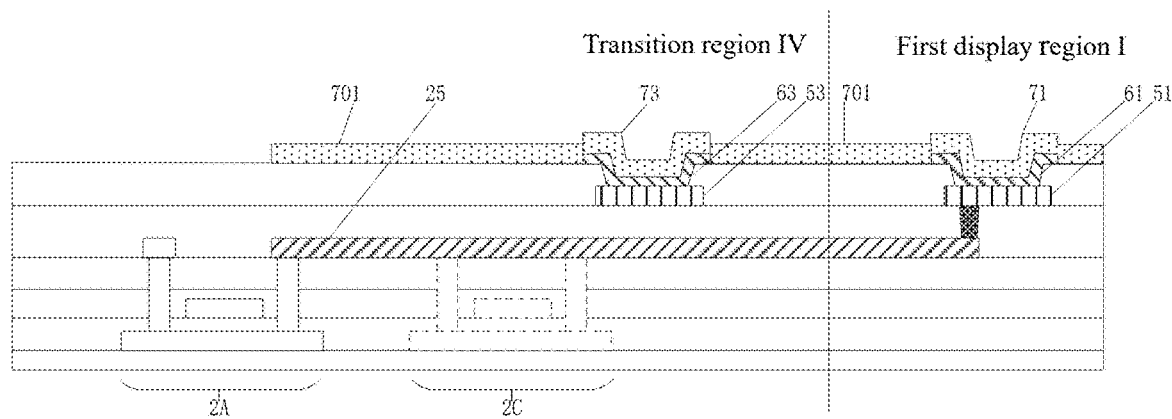
FIG. 6A is a first structural schematic diagram of a partial section of a junction of a first display region, a transition region and a second display region of a display substrate provided in an embodiment of the present disclosure.

As shown in FIGS. 1C and 1D, in an illustrative embodiment of the present disclosure, a transition region IV is further configured between the first display region I and the second display region II, and the transition region IV may surround the first display region I or only at a side or part of a side of the first display region I, which is not limited in the present disclosure. The first display region I and the transition region IV are both located in an under-screen camera region. FIG. 5A is an enlarged top view of a section of a B-B direction of a joint of the first display region I, the transition region IV and the second display region II in FIG. 1C or 1D. FIG. 6A is a sectional view of a boundary of a joint of the first display region I and the transition region IV. As shown in FIGS. 5A and 6A, the light emitting unit structure of the pixel in the first display region I is configured in the first display region I, while the first pixel circuit structure 2A corresponding to the light emitting unit structure is arranged in the transition region IV. Specifically, orthographic projections of transition pixels on the substrate further exist between an orthographic projection of the pixel light emitting unit structure in the first display region I on the substrate and an orthographic projection of the corresponding first pixel circuit structure 2A on the substrate. Light emitting unit structures of the transition pixels and a transition pixel circuit structure 2C are both arranged in the transition region. A light emitting unit structure of each transition pixel includes a fifth electrode 53, a third light emitting layer 63 and a sixth electrode 73. The transition region IV is additionally configured between the first display region I and the second display region II, and the transition pixels and the first pixel circuit structure 2A are arranged in the transition region IV. In this way, balance design between the number of pixel units and light transmittance in the under-screen camera region may be further optimized. Configuring the first display region I in the under-screen camera region may ensure transmittance of images collected by a camera, and additionally configuring the transition region may improve a pixel resolution of the under-screen camera region, so as to avoid excessive difference between a pixel density of the under-screen camera region and a pixel density of the second display region II.

In an illustrative embodiment of the present disclosure, as shown in FIGS. 5A and 6A, a first electrode 51 of the pixel light emitting unit structure arranged in the first display region I is electrically connected to a first signal wire 251 via a first electrode via hole 31. The first signal wire 251 extend from the first display region I into the transition region IV, and is electrically connected to the corresponding first pixel circuit structure 2A. The first electrode wiring 701 is further formed at a side of the first signal wire 251 away from the substrate 1. The first electrode wiring 701 connects the third electrode 71 in the first display region I and the sixth electrode 73 in the transition region IV, and finally is connected to the second display region II or the peripheral wiring region III, so as to receive a same electrode voltage (VSS) signal. Besides, the orthographic projection of the first electrode wiring 701 on the substrate 1 overlaps with the orthographic projection of the signal traveling line 25 on the substrate 1. In this way, a glare problem of the signal traveling line 25 in the first display region I and the transition region IV may be reduced.

Figure 5B:
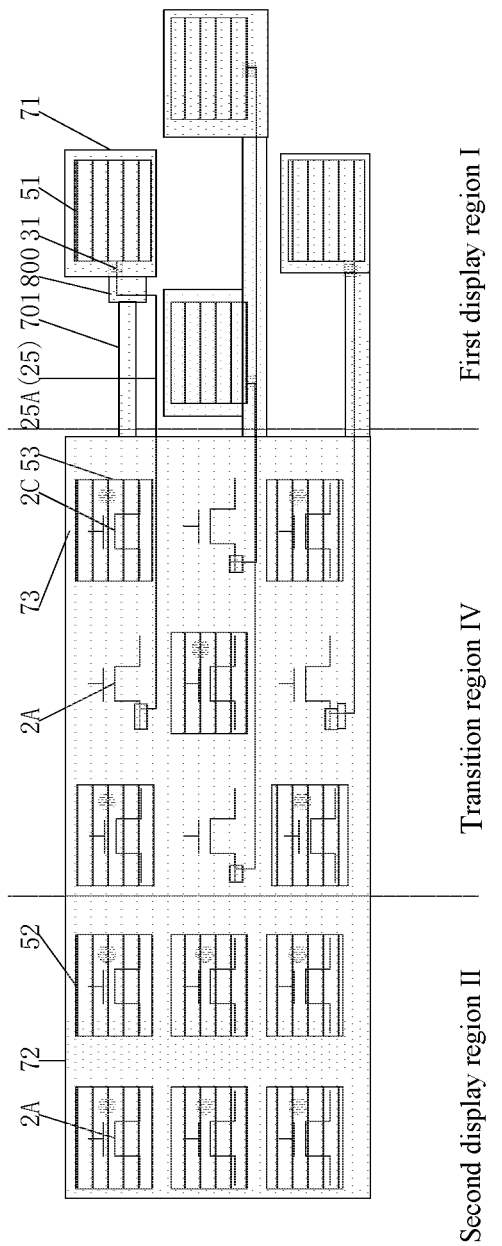
FIG. 5B is a second structural schematic diagram of a top view of a part of a junction of a first display region, a transition region and a second display region of a display substrate provided in an embodiment of the present disclosure.

In an illustrative embodiment of the present disclosure, as shown in FIG. 5B, the third electrode 71 in the first display region I is electrically connected to the sixth electrode 73 in the transition region IV via the first electrode wiring 701. It should be noted that, in the embodiments, the sixth electrodes 73 in the transition region IV and the fourth electrodes 72 in the second display region II may be integrally formed in the same layer and have same material, so as to simplify a process and reduce difficulty of preparing the sixth electrodes 73.

Figure 6B:
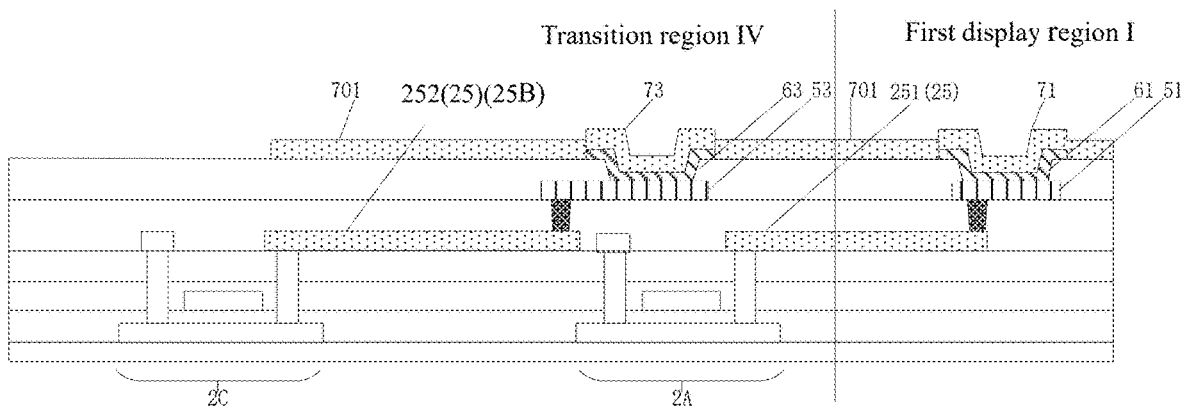
FIG. 6B is a second structural schematic diagram of a partial section of a junction of a first display region, a transition region and a second display region of a display substrate provided in an embodiment of the present disclosure.

In addition, FIGS. 5B and 6B further show that the signal traveling line 25 includes two kinds of signal traveling lines 25A and 25B. In an illustrative embodiment of the present disclosure, the signal traveling line 25A is configured to transmit signals of the first pixel circuit structure 2A to the first electrodes 51. The signal traveling line 25B is configured to transmit signals of the transition pixel circuit structure 2C to the fifth electrodes 53. In the embodiments, materials of the signal traveling line 25A and the signal traveling line 25B are inorganic metal oxides, such as indium tin oxide (ITO). The inorganic metal oxides are used to replace traditional metals such as titanium, aluminum and copper, so as to reduce adverse effects such as glare of metals and further improve transmittance. In the embodiments, the first electrode wiring 701 may further be arranged in the same layer as the signal traveling line 25A and the signal traveling line 25B (not shown in FIG. 6B). Preferably, the first electrode wiring 701, the signal traveling line 25A and the signal traveling line 25B may use the same inorganic metal oxide. Furthermore, the third electrode 71 are changed to a layer where the signal traveling line 25A is located via a corresponding third electrode connection part 800, and then connected to the first electrode wiring 701. Certainly, as a possible case, the first electrode wiring 701 may further be arranged between the signal traveling line 25 and the first electrodes 51. In this way, a more sufficient wiring space may be achieved and mutual signal crosstalk may be reduced.

Figure 7:
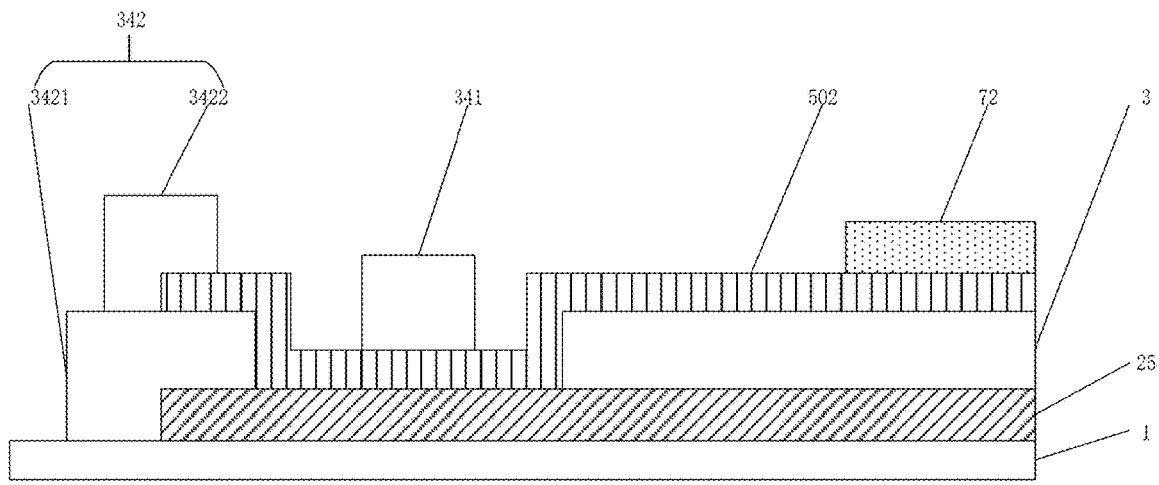
FIG. 7 is a sectional view of a C-C direction in FIG. 1A.

FIG. 7 is a sectional view of a C-C direction of a joint of the second display region II and the peripheral wiring region III in FIG. 1A. In the peripheral wiring region III, a second signal wire 252 is arranged in the same layer as the signal traveling line 25, so as to transmit the second supply voltage (VSS) signal. In an illustrative embodiment of the present disclosure, a fourth electrode 72 of the second display region II is connected to the second signal wire 252 by lapping second electrode wiring 502, so as to receive the second supply voltage (VSS) signal transmitted from the second signal wire 252. As shown in FIG. 7, the peripheral wiring region III is further provided with a first peripheral blocking dam 341 and a second peripheral blocking dam 342. The first peripheral blocking dam 341 and the plurality of second pixel definition layers 42 in the second display region II are formed in the same layer and have same material. The second peripheral blocking dam 342 includes a first heightening part 3421 and a second heightening part 3422. The first heightening part 3421 and the planarization layer 3 in the second display region II are formed in the same layer and have same material. The second heightening part 3422 and the plurality of second pixel definition layers 42 in the second display region II are formed in the same layer and have same material. Preferably, an orthographic projection of the first peripheral blocking dam 341 on the substrate 1 is completely located in an orthographic projection of the second electrode wiring 502 on the substrate 1 and an orthographic projection of the second signal wire 252 on the substrate 1. An orthographic projection of the second peripheral blocking dam 342 on the substrate 1 only partially overlaps the orthographic projection of the second electrode wiring 502 on the substrate 1 and partially overlaps the orthographic projection of the second signal wire 252 on the substrate 1, with an overlapping region closer to the second display region II. In this way, the overlapping area of the second electrode wiring 502 and the second signal wires 252 may be ensured, and a risk of disconnection may be reduced. In addition, it may be further ensured that the first peripheral blocking dam 341 and the second peripheral blocking dam 342 may effectively block invasion of external water and oxygen, and avoid failure of the second light emitting layers 62 in the second display region II.

Figure 8:
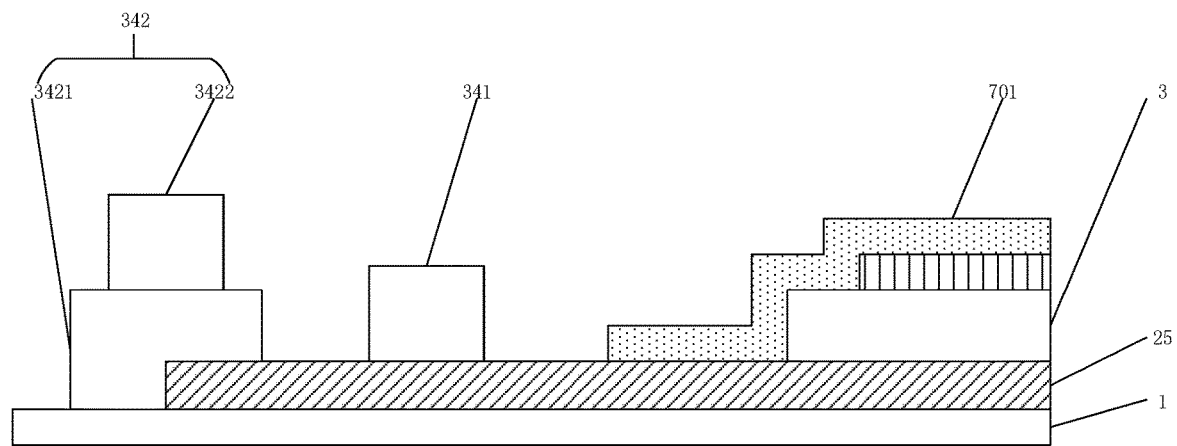
FIG. 8 is a first sectional view of a D-D direction in FIG. 1B.
Figure 9:
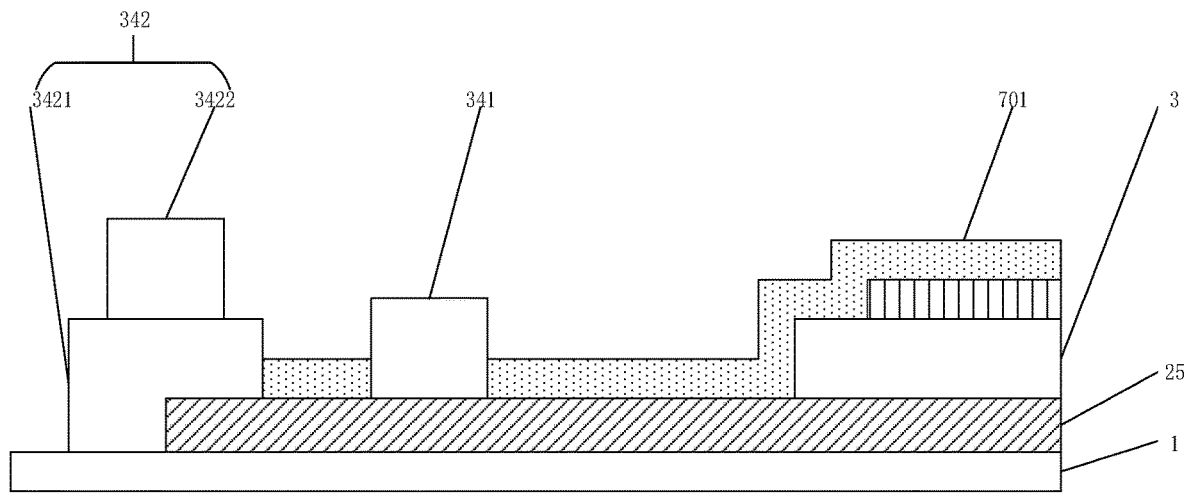
FIG. 9 is a second sectional view of a D-D direction in FIG. 1B.

FIG. 8 is a sectional view of a D-D direction of a joint of the first display region I and the peripheral wiring region III in FIG. 1B. In an illustrative embodiment of the present disclosure, the first electrode wiring 701 of the first display region I directly laps the second signal wires 252 in the peripheral wiring region III, and then is connected to the first display region I. In this way, the patterned third electrodes 71 in the first display region I can receive the second supply voltage (VSS) signals. In the embodiments, the orthographic projection of the first electrode wiring 701 on the substrate 1 does not overlap an orthographic projection of the first peripheral blocking dam 341 and does not overlap an orthographic projection of the second peripheral blocking dam 342 on the substrate. In addition, in some embodiments of the present disclosure, as shown in FIG. 9, the first electrode wiring 701 is further arranged between the first peripheral blocking dam 341 and the second peripheral blocking dam 342 in the peripheral wiring region III. In this way, the lower second signal wire 252 may be further shielded so as to reduce glare. Certainly, the first electrode wiring 701 may not be arranged between the first peripheral blocking dam 341 and the second peripheral blocking dam 342, so as to improve an effect of sealing the retaining walls and blocking water and oxygen.

In an illustrative embodiment of the present disclosure, when the transition region IV is further configured between the first display region I and the second display region II, the first electrode wiring in the transition region IV may lap the signal traveling line 25 in the peripheral wiring region III. In this way, the patterned third electrodes 71 in the first display region I receive the second supply voltage (VSS) signals. Besides, when any one of the plurality of fourth electrodes 72 of the second display region II is connected to a second signal wire 252 by lapping the second electrode wiring 502, so as to receive the second supply voltage (VSS) signals transmitted from the second signal wire 252, the first electrode wiring in the transition region IV may be connected to the fourth electrode 72 in the second display region II, so as to receive the same second supply voltage (VSS) signal.

Based on the same inventive concept, the embodiments of the present disclosure further provide a method for manufacturing a display substrate. The method includes:

providing a substrate 1 is provided;

forming a thin film transistor layer 2 and a planarization layer 3 sequentially on the substrate;

forming, by the thin film transistor layer, a first pixel circuit structure 2A in the first display region I on the substrate 1 and a second pixel circuit structure 2B in the second display region II on the substrate;

forming a plurality of first electrodes 51 arranged in the first display region I and a plurality of second electrodes 52 arranged in the second display region II at a side of the planarization layer 3 away from the substrate 1;

forming a first light emitting layers 61 at a side of each of the plurality of first electrodes 51 away from the substrate 1, and forming a second light emitting layer 62 at a side of each of the plurality of second electrodes 52 away from the substrate 1; and forming a third electrode 71 at a side of the first light emitting layer 61 away from the substrate 1, and forming a fourth electrode 72 at a side of the second light emitting layer 62 away from the substrate 1.

In an illustrative embodiment of the present disclosure, the step that forming the first light emitting layer 61 at the side of each of the plurality of first electrodes 51 away from the substrate 1, and forming the second light emitting layer 62 at the side of each of the plurality of second electrodes 52 away from the substrate 1 further includes the steps that the a first pixel definition layer 41 located in the first display region I is formed at the side of each of the plurality of first electrodes 51 away from the substrate 1, a plurality of first openings are formed by etching a plurality of first pixel definition layers 41, and each of the first openings exposes at least part of the corresponding first electrode 51; a second pixel definition layer 42 located in the second display region II are further formed at a side of each of the plurality of second electrodes 52 away from the substrate 1, a plurality of second openings are formed by etching a plurality of second pixel definition layers 42, and each of the second openings exposes at least part of the corresponding second electrode 52.

In an illustrative embodiment of the present disclosure, the step that forming the third electrode 71 at the side of the first light emitting layer 61 away from the substrate 1, and forming fourth electrode 72 at a side of the second light emitting layer 62 away from the substrate 1 includes the following steps: forming a first cathode material layer 711 at a side of the second light emitting layer 62 away from the substrate 1 in the second display region II. Magnesium-silver alloy may be selected as a material of the first cathode material layer 711. Then, forming second cathode material layer 712 at the side of the first light emitting layer 61 in the first display region I away from the substrate and the side of the second light emitting layer 62 in the second display region II away from the substrate. In the second display region II, the second cathode material layer 712 are arranged at a side of the first cathode material layer 711 away from the substrate. Only the second cathode material layer 712 is arranged in the first display region I, so as to ensure high transmittance of the first display region I. Metal oxides with high transmittance such as ITO and indium zinc oxide (IZO) may be selected as materials of the second cathode material layers 712. Laser cutting is conducted on the cathode material layer 712 in the first display region I, so as to form the plurality of third electrodes 71. The orthographic projection of each of the plurality of third electrodes 71 on the substrate 1 covers the orthographic projections of M number of first openings on the substrate 1, and the orthographic projection of each of the plurality of fourth electrodes 72 on the substrate 1 covers the orthographic projections of N number of second openings on the substrate 1, where M is less than N.

In an illustrative embodiment of the present disclosure, as shown in FIG. 3A, in the first display region I, the orthographic projection of one third electrode 71 on the substrate 1 cover the orthographic projection of one first opening, or the orthographic projections of 3 number of first openings, or the orthographic projections of 6 number of first openings on the substrate 1. In the second display region II, the number of the fourth electrode 72 is 1, and the orthographic projection of the fourth electrode 72 on the substrate 1 cover the orthographic projections of all the second openings on the substrate 1. Only the plurality of third electrodes 71 are subjected to laser cutting, and the fourth electrode 72 are not subjected to subsequent etching or cutting after a whole layer is formed through evaporation or sputtering, so that a manufacturing yield of the whole display substrate may be improved, and a risk of failure of the first light emitting layers 61 and the second light emitting layers 62 arranged close to the substrate side may be reduced.

In an illustrative embodiment of the present disclosure, the second cathode material layer 712 is formed at the side of the first light emitting layer 61 away from the substrate and the side of the second light emitting layer 62 away from the substrate. The step that forming the plurality of third electrodes 71 by conducting laser cutting on the second cathode material layers 712 in the first display region I further includes the following step that forming a plurality of pieces of first electrode wiring 701 and the plurality of third electrode connection parts 800 by conducting laser cutting on the second cathode material layer 712 in the first display region I. The plurality of first electrode wirings 701 and the plurality of third electrode connection parts 800 connect all the plurality of third electrodes 71 of the first display region I and receive the second supply voltage (VSS) signal of the peripheral wiring region III. Certainly, the plurality of first electrode wirings 701 and the plurality of third electrode connection parts 800 may further connect all the third electrodes 71 of the first display region I and the fourth electrode 72 of the second display region II, so as to receive the same second supply voltage (VSS) signal. The solution is described in detail in other embodiments of the present disclosure, which will not be repeated herein.

In an illustrative embodiment of the present disclosure, the transition region IV is further formed on the substrate 1, the transition region IV is arranged between the first display region I and the second display region II, and the thin film transistor layer 2 is provided with the second pixel circuit structure 2B arranged in the second display region II, and the first pixel circuit structure 2A and the transition pixel circuit structure 2C that are arranged in the transition region IV on the substrate 1. The fifth electrode 53 is formed at a side of the transition pixel circuit structure 2C away from the substrate. The fifth electrode 53, the first electrodes 51 and the second electrodes 52 are formed in the same layer, material and process. Preferably, the fifth electrode 53, the first electrodes 51 and the second electrodes 52 may be made of ITO/silver (Ag)/ITO. In the transition region IV, the third light emitting layer 63 is further formed at a side of the fifth electrode 53 away from the substrate. Preferably, the third light emitting layer 63 may be formed in the same step as the first light emitting layers 61 and the second light emitting layers 62, so as to save cost and improve uniformity of display. It should be noted that the first light emitting layers 61, the second light emitting layers 62 and the third light emitting layer 63 are formed in a unified step, which does not indicate that arrangement modes of light emitting unit structures in the three regions are consistent. Certainly, it is also possible to make different masks to form light emitting layers in the three regions respectively. The light emitting layers in the present application include at least one of layers of hole injection, hole transport, organic light emission, electron transport and electron injection. In addition, any two of the three regions may be formed jointly, for example, the first light emitting layers 61 of the first display region I and the third light emitting layer 63 of the transition region IV are formed jointly, and the second light emitting layers 62 of the second display region II are formed separately, which are not limited by the present disclosure.

In an illustrative embodiment of the present disclosure, the sixth electrode 73 arranged in the transition region IV is further formed at the side of the third light emitting layer 63 away from the substrate 1. The sixth electrode 73 and the plurality of third electrodes 71 in the first display region I are manufactured in the same step. Specifically, after the first cathode material layer 711 is formed in the second display region II, the second cathode material layer 712 is formed in the first display region I, the second display region II and the transition region IV. Then, laser cutting is conducted on the second cathode material layers 712 in the first display region I and the transition region IV, so as to form the plurality of third electrodes 71 and the sixth electrode 73 separately.

Based on the same inventive concept, the embodiments of the present disclosure further provide a display panel. The display panel includes the display substrate provided in any one of the embodiments.

The display panel further includes other necessary structures known to those skilled in the art, which will not be repeated herein.

Based on the same inventive concept, the embodiments of the present disclosure further provide a display device. The display device includes the display panel provided in the embodiments.

The display panel and the display device have all the advantages of the display substrate provided in the embodiments, and may be implemented by referring to any one of the embodiments of the display substrate, which will not be repeated herein.

The display device may be any product or component with a display function, such as a mobile phone, a tablet computer, a television, a display, a notebook computer, a digital photo frame and a navigator. Other essential components of the display device should be understood by those of ordinary skill in the art, which will not be repeated herein and should not limit the present disclosure. The implementation of the display device may refer to the embodiments of the display panel, which will not be repeated herein.

Apparently, those skilled in the art may make various modifications and variations to the present disclosure without departing from the spirit and scope of the present disclosure. In this way, if the modifications and variations of the present disclosure fall within the scope of the claims of the present disclosure and their equivalent technologies, the present disclosure is also intended to include the modifications and variations.

What is claimed is:

1. A display substrate, comprising:
   a substrate;
   a first display region and a second display region, arranged on the substrate;
   a thin film transistor layer arranged on the substrate, and a planarization layer arranged at a side of the thin film transistor layer away from the substrate;
   a plurality of signal traveling lines, electrically connected to the thin film transistor layer in the first display region;
   a plurality of first electrodes arranged in the first display region and a plurality of second electrodes arranged in the second display region, wherein the plurality of first electrodes and the plurality of second electrodes are arranged at a side of the planarization layer away from the substrate;
   a pixel defining layer, arranged at a side of the plurality of first electrodes and the plurality of second electrodes away from the substrate, wherein the pixel defining layer comprises a plurality of first openings arranged in the first display region and a plurality of second openings arranged in the second display region, each of the plurality of first openings exposes at least part of one of the plurality of first electrodes, and each of the plurality of second openings exposes at least part of one of the plurality of second electrodes;
   a plurality of light emitting layers, arranged on the plurality of first openings and the plurality of second openings; and
   a plurality of third electrodes and one or more fourth electrodes, arranged at a side of the plurality of light emitting layers away from the substrate, wherein the plurality of third electrodes are arranged in the first display region, and the one or more fourth electrodes are arranged in the second display region,
   an orthographic projection of each of the plurality of third electrodes on the substrate covers orthographic projections of a number M of first openings on the substrate, and an orthographic projection of each of the one or more fourth electrodes on the substrate covers orthographic projections of a number N of second openings on the substrate, wherein M is less than N.

2. The display substrate according to claim 1, wherein M is equal to 1, N is greater than or equal to 2, and a quantity of the fourth electrode is 1.

3. The display substrate according to claim 1, further comprising:
   a plurality of first electrode wirings arranged in the first display region, wherein the plurality of first electrode wirings are arranged at a side of the planarization layer away from the substrate.

4. The display substrate according to claim 3, wherein each of the plurality of third electrodes further comprises a third electrode connection part corresponding to the each third electrode, the each third electrode is electrically connected to a corresponding first electrode wiring via the third electrode connection part, and a quantity of third electrode connection parts is less than or equal to a quantity of the plurality of first openings.

5. The display substrate according to claim 4, wherein the plurality of signal traveling lines are arranged in a same layer as a source electrode and a drain electrode in the thin film transistor layer, and orthographic projections of the plurality of first electrode wirings on the substrate overlap orthographic projections of the plurality of signal traveling lines on the substrate, with an overlapping area not less than 90% of an area of the orthographic projections of the plurality of the first electrode wirings on the substrate.

6. The display substrate according to claim 1, wherein a transition region is further provided between the first display region and the second display region; and
   the thin film transistor layer, in the transition region, is provided with a first pixel circuit structure for controlling and driving pixels in the first display region to emit light and a transition pixel circuit structure for controlling and driving pixels in the transition region to emit light.

7. The display substrate according to claim 6, wherein in the first display region, any one of the plurality of first electrode is electrically connected to a first signal wire through a first electrode via hole; and
   the first signal wire extends from the first display region to the transition region, and transmits a circuit signal of the first pixel circuit structure arranged in the transition region to a corresponding first electrode arranged in the first display region.

8. The display substrate according to claim 1, wherein a periphery of the display substrate is further provided with a peripheral wiring region, the peripheral wiring region is provided with a second signal wire arranged at a same layer as the plurality of signal traveling lines, and any one of the one or more fourth electrodes is electrically connected to the second signal wire through a second electrode wiring.

9. The display substrate according to claim 8, wherein in the peripheral wiring region, a first electrode wiring is directly connected with the second signal wire.

10. The display substrate according to claim 8, wherein the peripheral wiring region is provided with a first peripheral blocking dam and a second peripheral blocking dam, an orthographic projection of the first peripheral blocking dam on the substrate is located in an orthographic projection of the second electrode wiring on the substrate and an orthographic projection of the second signal wire on the substrate, and an orthographic projection of the second peripheral blocking dam on the substrate partially overlaps with the orthographic projection of the second electrode wiring on the substrate and partially overlaps with the orthographic projection of the second signal wire on the substrate.

11. The display substrate according to claim 10, wherein an orthographic projection of the first electrode wiring on the substrate does not overlap with the orthographic projection of the first peripheral blocking dam on the substrate and does not overlap with the orthographic projection of the second peripheral blocking dam on the substrate.

12. The display substrate according to claim 3, wherein materials of the plurality of third electrodes, the one or more fourth electrodes, the plurality of first electrode wirings and the plurality of signal traveling lines comprise at least one of indium tin oxide and indium zinc oxide; and
the materials of the one or more fourth electrodes further comprise at least one of magnesium and silver.

13. A method for manufacturing a display substrate according to claim 1, comprising:
providing the substrate; wherein
the first display region and the second display region is arranged on the substrate;
sequentially forming the thin film transistor layer and the planarization layer on the substrate;
forming a first pixel circuit structure by a part of the thin film transistor layer corresponding to the first display region on the substrate, and forming a second pixel circuit structure by another part of the thin film transistor layer corresponding to the second display region on the substrate;
forming a plurality of first electrodes arranged in the first display region and a plurality of second electrodes arranged in the second display region at a side of the planarization layer away from the substrate;
forming a first light emitting layer at a side of each of the plurality of first electrodes away from the substrate, and forming a second light emitting layer at a side of each of the plurality of second electrodes away from the substrate; and
forming a third electrode at a side of the first light emitting layer away from the substrate, and forming a fourth electrode at a side of the second light emitting layer away from the substrate.

14. The method according to claim 13, wherein the forming the third electrode at the side of the first light emitting layer away from the substrate, and forming the fourth electrode at the side of the second light emitting layer away from the substrate comprise:
forming a first cathode material layer at the side of the second light emitting layer away from the substrate in the second display region, wherein materials of the first cathode material layers comprise at least one of magnesium and silver;
forming a second cathode material layer at the side of the first light emitting layer in the first display region away from the substrate and the side of the second light emitting layer in the second display region away from the substrate, wherein in the second display region, the second cathode material layers are arranged at a side of the first cathode material layer away from the substrate; and
forming a plurality of third electrodes and a plurality of first electrode wirings by conducting laser cutting on the second cathode material layer in the first display region.

15. The method according to claim 13, wherein the method further comprises:
forming a transition region on the substrate, wherein the transition region is arranged between the first display region and the second display region, and the transition region is provided with the first pixel circuit structure and a transition pixel circuit structure; and
forming a fifth electrode, a third light emitting layer, and a sixth electrode sequentially at a side of the transition pixel circuit structure away from the substrate.

16. The method according to claim 15, wherein forming the sixth electrode at the side of the transition pixel circuit structure away from the substrate comprises:
forming the second cathode material layer in the transition region and the first display region; and
forming the sixth electrode and the third electrode by conducting laser cutting on the second cathode material layer.

17. A display panel, comprising the display substrate according to claim 1.

18. A display device, comprising the display panel according to claim 17.

* * * * *